(12) United States Patent
Seo et al.

(10) Patent No.: US 6,731,586 B2
(45) Date of Patent: May 4, 2004

(54) APPARATUS FOR AND METHOD OF CONTROLLING AUTO LASER DIODE POWER

(75) Inventors: Jin gyo Seo, Suwon (KR); Kyoung-bog Jin, Suwon (KR); Sung-ro Go, Kunpo (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 09/816,109

(22) Filed: Mar. 26, 2001

(65) Prior Publication Data

US 2001/0024459 A1 Sep. 27, 2001

(30) Foreign Application Priority Data

Mar. 24, 2000 (KR) .......................................... 2000-15031
Feb. 13, 2001 (KR) ........................................... 2001-6979

(51) Int. Cl.[7] .............................................. G11B 7/007
(52) U.S. Cl. .................. 369/116; 369/53.26; 369/59.11
(58) Field of Search .............................. 369/116, 53.27, 369/47.51, 53.26, 59.11

(56) References Cited

U.S. PATENT DOCUMENTS

| | | | |
|---|---|---|---|
| 4,796,250 A | | 1/1989 | Kobayashi et al. ...... 369/53.26 |
| 5,490,127 A | * | 2/1996 | Ohta et al. ............... 369/47.51 |
| 5,546,372 A | * | 8/1996 | Ohsawa et al. ............. 369/116 |
| 5,586,098 A | * | 12/1996 | Nishida et al. ............. 369/116 |
| 5,732,061 A | * | 3/1998 | Kirino et al. ............... 369/116 |
| 5,991,251 A | * | 11/1999 | Sakurai et al. ............. 369/53.2 |
| 6,222,815 B1 | * | 4/2001 | Nagano ................... 369/47.51 |
| 6,317,405 B1 | * | 11/2001 | Arai ........................... 369/116 |
| 6,341,117 B1 | * | 1/2002 | Seo ............................ 369/116 |

FOREIGN PATENT DOCUMENTS

EP    0933759 A2    8/1999

* cited by examiner

Primary Examiner—William Korzuch
Assistant Examiner—Kim-Kwok Chu
(74) Attorney, Agent, or Firm—Staas & Halsey LLP

(57) ABSTRACT

An optical recording/reproducing apparatus which controls the power of a laser diode (LD) and a method therefor. A current power level of an optical signal output by the LD is compared with a reference level and the output of the LD is controlled according to the comparison result. A photo detector (PD) monitors the current power level of the optical signal output by the LD. The current power level is compared with a reference level and power to the LD is controlled based on the comparison. Two different control loops are provided. In a first loop, comparison data is continually provided and in a second loop, sampled comparison data is provided based on a non return to zero inverted (NRZI) signal. Rapid change in an optical output is controlled using the different loops according to a kind and state of a medium such as a disc.

29 Claims, 6 Drawing Sheets

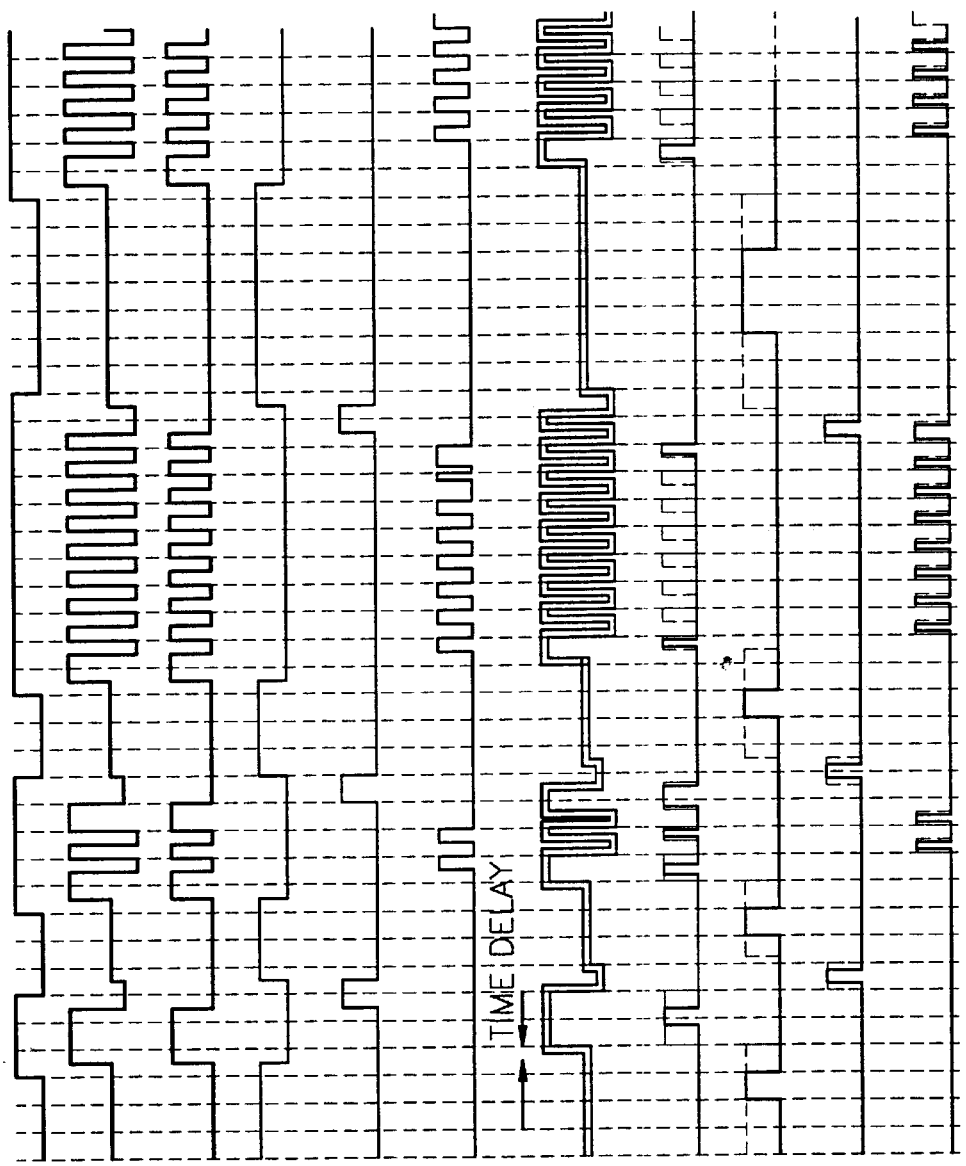

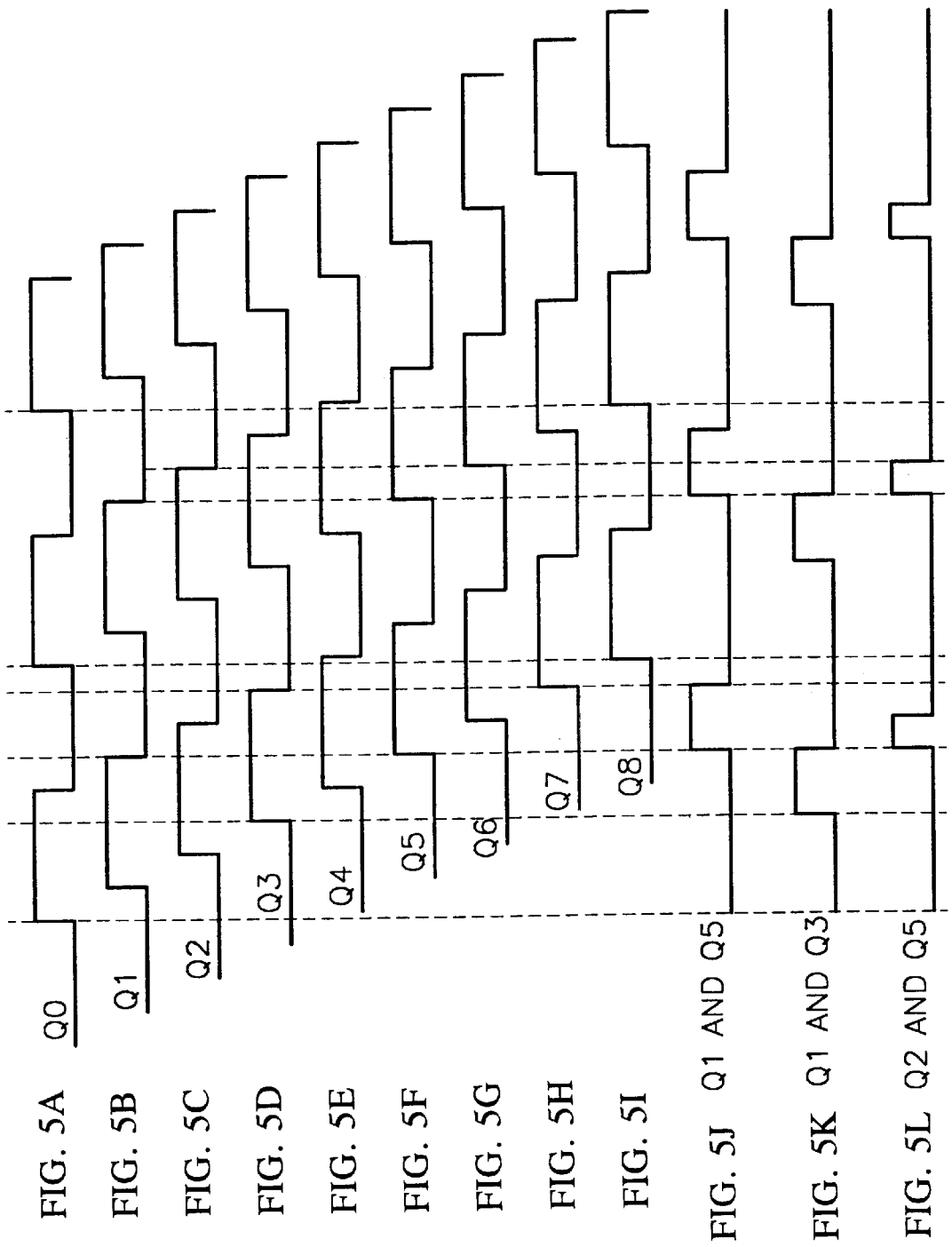

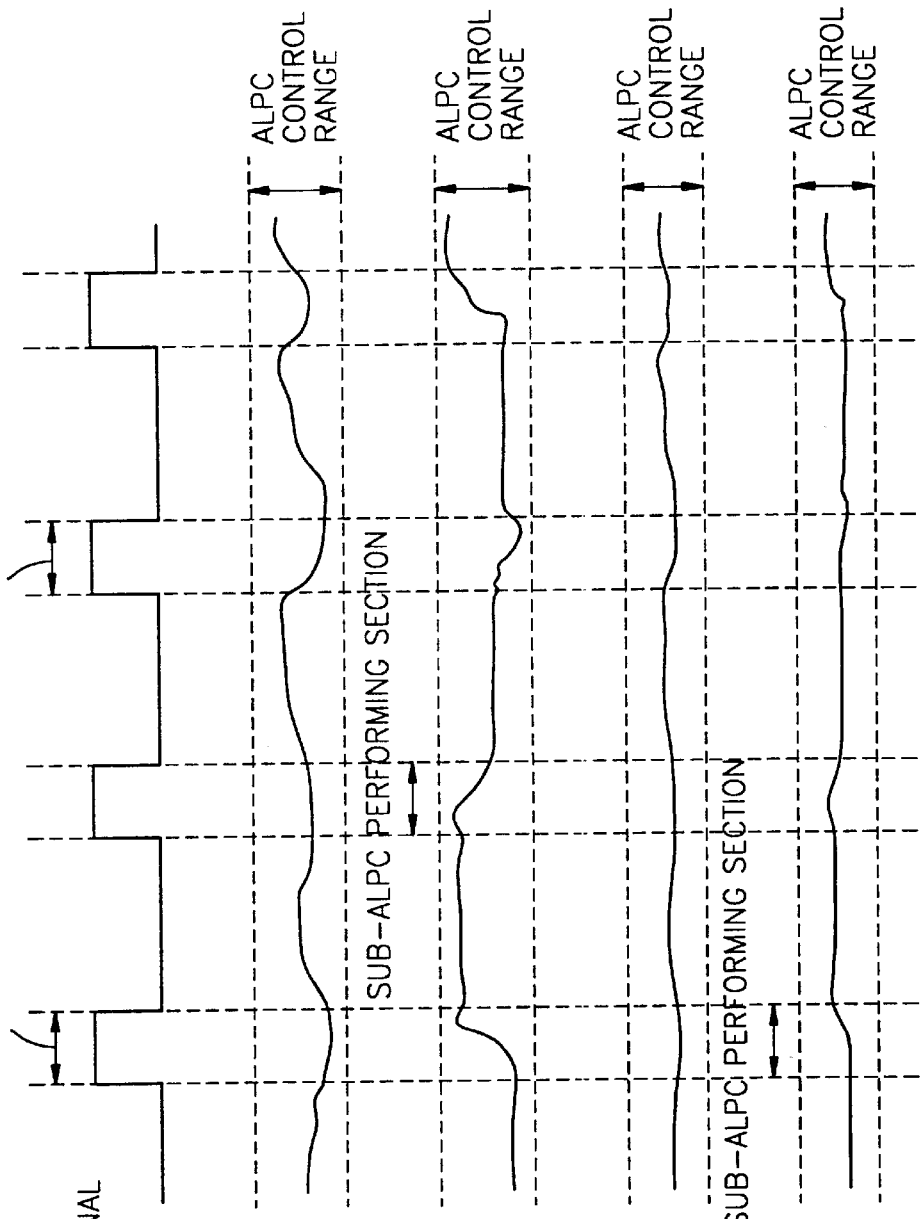

APPARATUS FOR AND METHOD OF CONTROLLING AUTO LASER DIODE POWER

CROSS-REFERENCE TO RELATED APPLICATIONS

This application claims the benefit of Korean Application Nos. 00-15031 and 01-6979 filed Mar. 24, 2000 and Feb. 13, 2001, respectively, in the Korean Patent Office, the disclosures of which are incorporated herein by reference.

BACKGROUND OF THE INVENTION

1. Field of the Invention

The present invention relates to an apparatus for optical recording/reproducing and a method therefor, and more particularly, to an auto laser diode power controlling apparatus for controlling a power level of a laser diode to be in an optimal state and a method therefor.

2. Description of the Related Art

Modern society is often called an information-oriented society or a multimedia society. In this society, high capacity recording media are required. Magnetic optical disc drives (MODDs) and digital versatile disc random access memories (DVD-RAMs), which are optical recording apparatuses, are used as the recording media. Since the optical recording apparatuses use laser diodes, the performance of equipment is determined by controlling the laser diodes to be in an optimal state. Since the types of recording pulses required by the respective optical recording devices are different, effective compensation for the different types of recording pulses is required.

FIG. 1 is a block diagram showing the structure of a conventional apparatus for controlling auto laser diode power level.

The apparatus shown in FIG. 1 includes an interface portion 110, a decoder 120, an address controller 130, a pulse generator 140, an auto laser diode power control (ALPC) block 150, a laser diode (LD) driver 160, a photodetector 170, and a time delay 180.

The interface portion 110 communicates with an external processor (not shown), for example, the microprocessor of a computer, and transmits information on recording/reproducing data, control data, and a use mode to the micro processor, and receives information on recording/reproducing data, control data, and a use mode from the micro processor. The decoder 120 includes an address decoder 121, a register 122, and a multiplexer 123 for selecting one among various registers included in the register 122. The address controller 130 may also include various registers and sub blocks for realizing functions and controls the entire apparatus.

The laser diode driver 160 is a device in which high speed switching can be performed, and can include an additional common use integrated circuit (IC) or an application specific integrated circuit (ASIC). The pulse generator 140 generates a signal for generating and controlling the respective recording pulses for forming a domain on a recording medium corresponding to data to be recorded. The time delay 180 is for delaying a signal from the pulse generator 140.

The ALPC block 150 detects a difference between a reference power level provided by the decoder 120 and the current power level provided from the photodetector 170 and controls the laser diode driver 160 according to the detection result.

The operation of the apparatus shown in FIG. 1 will be described. Since the interface portion 110 is different according to the structure of a particular system, the following explanation assumes that the functions of the interface portion 110 have already been performed.

The decoder 120 selects and maintains a target power level (read power, erase power, and peak power as a reference power level). The selected reference power level is input to the ALPC block 150, to which at least three reference power levels such as the read power, the erase power, and the peak power are input.

The respective reference power levels are digital to analog converted by a first D/A converter 151 and provided to a comparator 152. The photodetector signal output from the photodetector 170 is provided to the comparator 152 through a buffer (not shown). At this time, a signal to control the operation of the comparator 152 is generated by the pulse generator 140 and provided to the comparator 152 through the time delay 180.

An up/down counter 153 performs up or down counting according to the comparison result of the comparator 152. An output of the up/down counter 153 is selected by a second demultiplexer 154, converted into an analog to digital signal through a second D/A converter 155, and provided to the LD driver 160. A control signal for controlling the respective power levels provided by the ALPC block 150 and the respective power levels provided by the pulse generator 140 is input to the LD driver 160.

The apparatus shown in FIG. 1 uses the up/down counter 153 in performing controlling by comparing a reference power level with a fed back current power level. However, as the reproducing and recording speed of media becomes faster, controlling speed and a control range are restricted by the operation speed of the up/down counter 153.

Since the width of a recording pulse becomes shorter and more complicated as the recording speed of media increases, a compensation for these characteristics of the recording pulse is necessary.

SUMMARY OF THE INVENTION

To solve the above problems, it is an object of the present invention to provide an auto laser diode power controlling apparatus for controlling a laser diode to be in an optimal state.

It is another object of the present invention to provide an auto laser diode power controlling method of controlling a laser diode to be in an optimal state.

Additional objects and advantages of the invention will be set forth in part in the description which follows, and, in part, will be obvious from the description, or may be learned by practice of the invention.

Accordingly, to achieve the above and other objects of the present invention, there is provided an auto laser diode power controlling apparatus for controlling the output of a laser diode by comparing the current power level of an optical signal output by the LD with a reference power level and controlling the output of the LD according to the comparison result. A photo detector (PD) monitors the current power level of the optical signal output by the LD. A sampler and holder samples and holds the current power level output from the PD. A sample and hold control signal generator generates a sample and hold control signal which controls the sampling operation of the sampler and holder on the basis of a non return to zero inverted (NRZI) signal, and an operator compares the current power level sampled by the sampler and holder with the reference power level and controls the output of the LD according to the difference value.

To achieve another object, there is provided an auto laser diode power controlling method which controls the output of a laser diode by comparing the current power level with a reference power level and controlling the output of the LD according to the comparison result. The method comprises monitoring the current power level of an optical signal output from the LD with a photodetector (PD), sampling and holding the current power level output from the PD on the basis of a NRZI signal, comparing the sampled and held current power level with the reference power level and controlling the output of the LD according to a difference level between the sampled and held current power level and the reference level.

BRIEF DESCRIPTION OF THE DRAWINGS

The above objects and advantages of the present invention will become more apparent by describing in detail a preferred embodiment thereof with reference to the attached drawings in which:

FIGS. 4A–4K are related waveforms which form a timing diagram for schematically showing the operation of the apparatus shown in FIG. 3;

FIGS. 5A–5L are related waveforms which form a timing diagram for schematically showing the generation of a sample and hold control signal by a delayed control signal; and FIGS. 6A–6E are related waveforms which schematically show the operation modes of the operator shown in FIG. 3.

DESCRIPTION OF THE PREFERRED EMBODIMENTS

Figure 1:
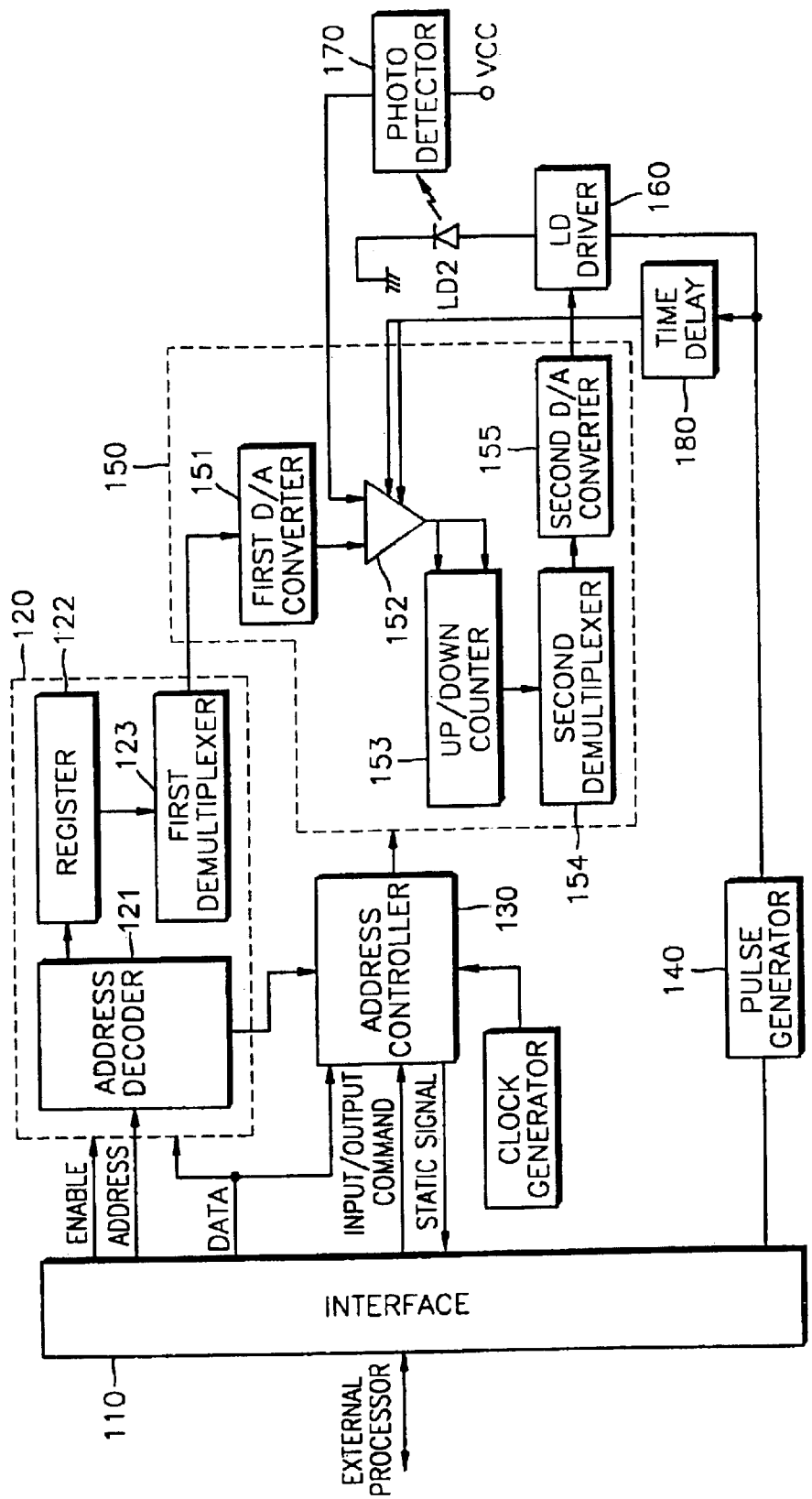
FIG. 1 is a block diagram showing the structure of a conventional apparatus for controlling auto laser diode power.

Reference will now be made in detail to the embodiments of the present invention, examples of which are illustrated in the accompanying drawings, wherein like reference numerals refer to like elements throughout.

A conventional apparatus, as shown in FIG. 1, for controlling auto laser diode power uses an up/down counter in performing control by comparing a reference power level with a fed back current power level. As a result, speed and a control range are restricted. Also, when the recording speed of media increases, the shape of a recording pulse becomes complicated and the width of a recording pulse becomes smaller as the recording speed increases.

Figure 2:
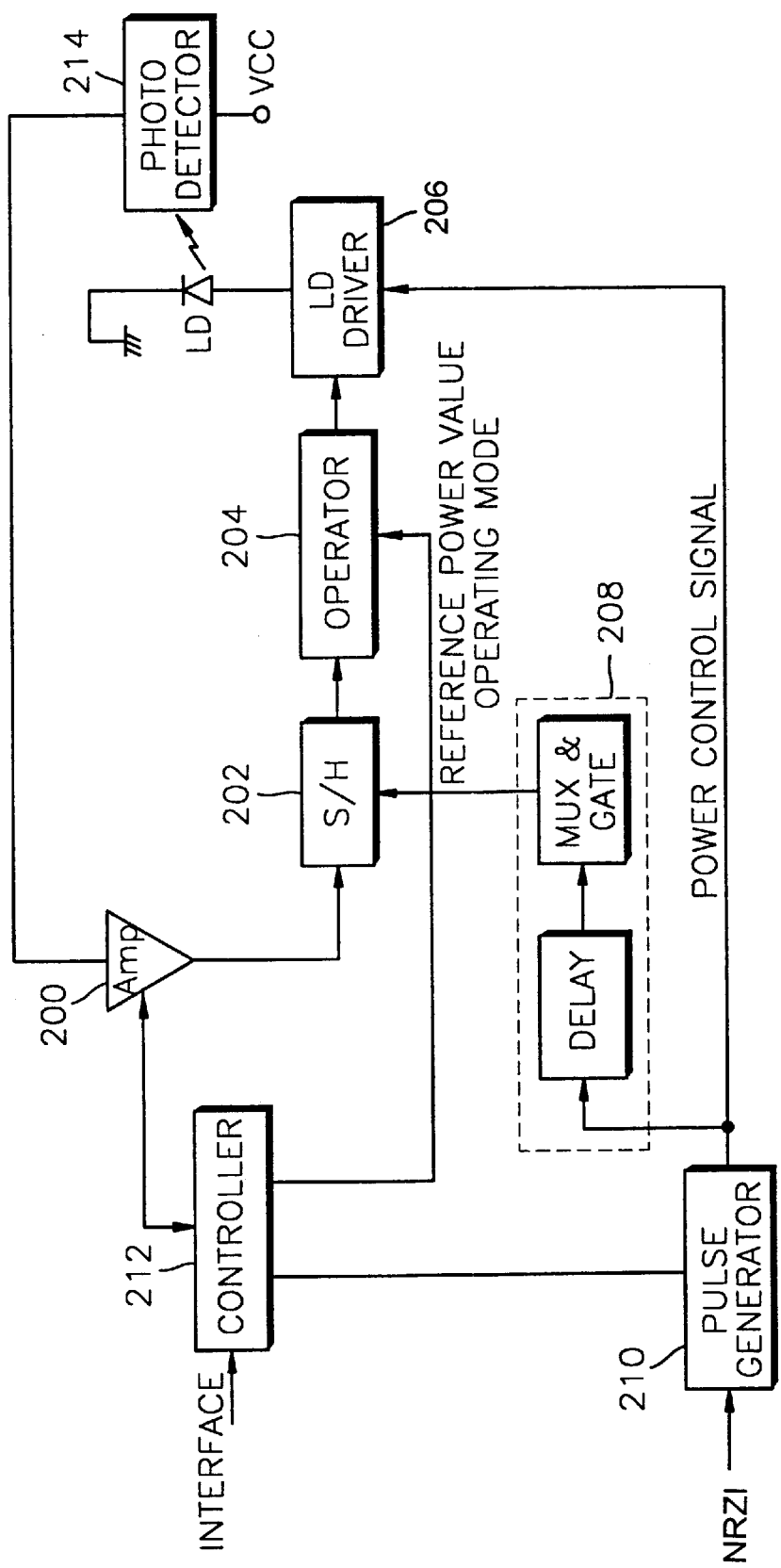
FIG. 2 is a block diagram showing the structure of an apparatus for controlling auto laser diode power according to one embodiment of the present invention.

According to the present invention, an apparatus for controlling auto laser diode power and a method therefor including a method of sampling and holding an input signal in a desired position for a desired period are provided. FIG. 2 is a block diagram showing the structure of an apparatus for controlling auto laser diode power according to an embodiment of the present invention.

The apparatus shown in FIG. 2 includes an amplifier 200, a sampler and holder 202, an operator 204, a laser diode driver 206, a sampling and holding control signal generator 208, a pulse generator 210, and a controller 212, and a photodetector 214.

The output of a laser diode (LD) is controlled by the laser diode driver 206 and the output level is detected by a photodetector (PD) 214. A signal from the photodetector (PD) 214 shows the current power level of an optical signal output from the LD. The photodetector 214 signal has a form in which the recording pulse applied to the LD is temporally delayed. The length of the delay is dependent on the operation characteristics of the LD, the PD 214, and the amplifier 200 and is relatively constant after an apparatus is constructed.

A recording pulse is a multiple pulse comprising a first pulse, a multi-pulse train, a last pulse, and a cooling pulse. Each of the pulses has one power level among a read power level, a peak power level, a bias1 power level, a bias2 power level, and a bias3 power level. Namely, the level of the recording pulse changes on a temporal axis and becomes one power level among the read power level, the peak power level, the bias1 (or erase) power level, the bias2 (or cooling) power level, and the bias3 (or bottom) power level.

The recording pulse is created on the basis of a non return to zero inverted (NRZI) signal. The starting/ending positions, the pulse widths, and the power levels of the respective pulses, which form the recording pulse, change according to the correlation of front and rear spaces on the basis of the current mark.

The pulse generator 210 generates an NRZI signal and a power level control signal for turning on and off the respective power levels according to the correlation between the mark and the space. The power level control signal includes a read control signal, a peak control signal, a bias1 control signal, a bias2 control signal, and a bias3 control signal for controlling the read power level, the peak power level, the bias1 power level, the bias2 power level, and the bias3 power level, respectively.

The sampler and holder 202 samples the amplitude of a photodetector 214 signal at a certain point in time, obtains a current power value, and provides the obtained sampled current power value to the operator 204.

The operator 204 compares the reference power level with the sampled current power value and controls the output of the LD via the LD driver 206 according to the comparison result. To be specific, the operator 204 changes the level of the driving power provided to the LD according to the comparison result. The LD driver 206 changes the output of the LD according to a driving power level change value which is output by the operator 204.

The driving powers corresponding to the respective power levels are provided to the LD driver 206. The level of the driving power varies according to the output of the operator 204. Also, the LD driver 206 drives the LD by selectively combining the respective driving power levels and the driving power level is selected by a power level control signal.

Figure 3:
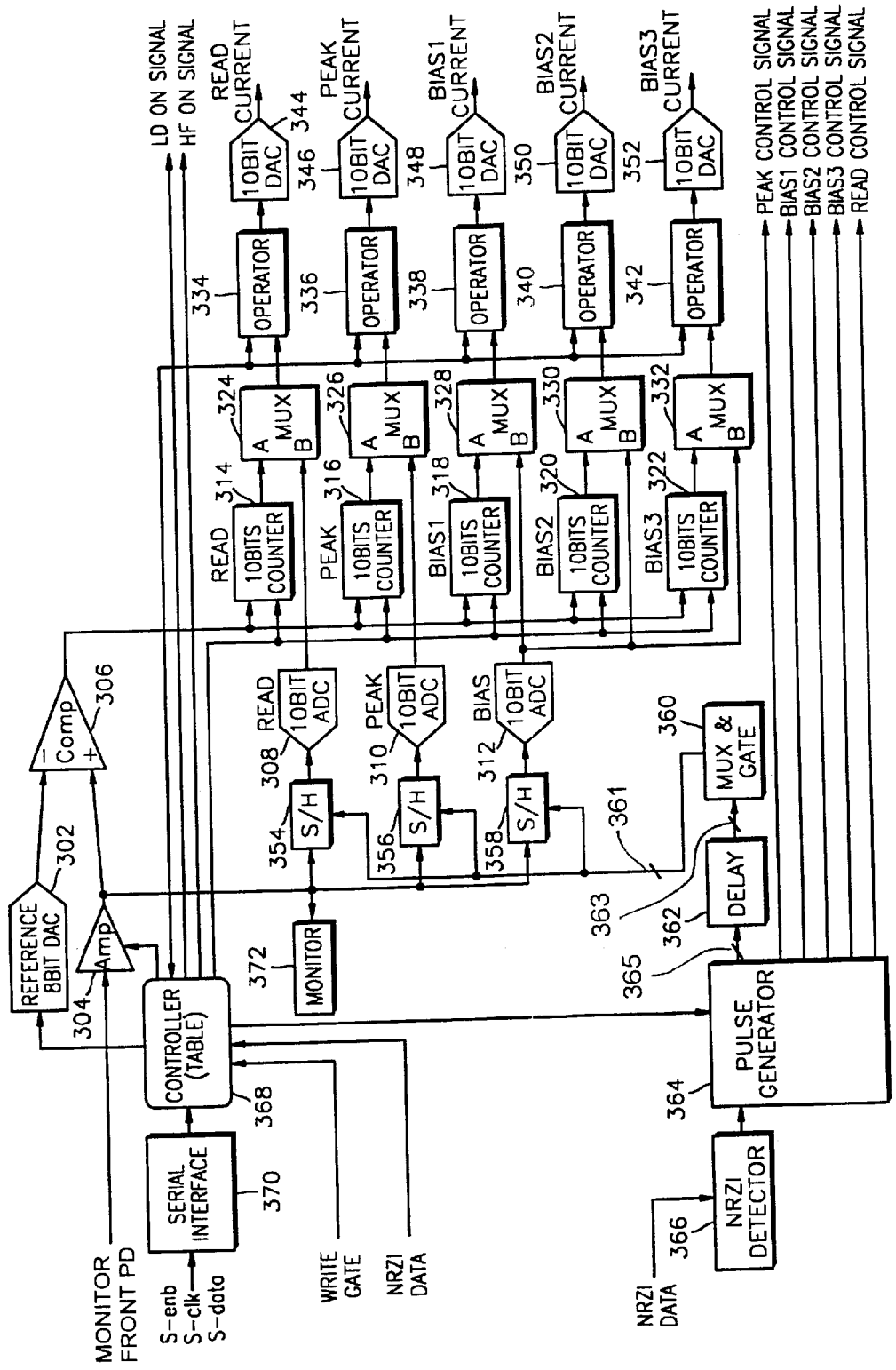
FIG. 3 is a block diagram showing the structure of an apparatus for controlling auto laser diode power according to another embodiment of the present invention.

FIG. 3 is a block diagram showing another embodiment of an apparatus for controlling auto laser diode power according to the present invention. The apparatus shown in FIG. 3 includes a reference digital to analog converter (DAC) 302, a switching amplifier 304, a comparator 306, analog-to-digital converters (ADCs) 308, 310 and 312, up/down counters 314, 316, 318, 320 and 322, multiplexers 324, 326, 328, 330 and 332, operators 334, 336, 338, 340 and 342, DACs 344, 346, 348, 350 and 352, samplers and holders 354, 356 and 358, a multiplexer and gate 360, a delay 362, a pulse generator 364, an NRZI detector 366, a controller 368, a serial interface 370, and a monitor 372.

The reference DAC 302 digital-to-analog converts the reference power level provided by the controller 368 and provides the digital-to-analog converted value to the inverting input terminal of the comparator 306.

The reference power level varies according to a disc format such as CD, CD-R, DVD, DVD–RW, and DVD+RW, the kind of a medium, and a manufacturer of the disc and the reference power level is provided to the controller 368 through the interface 370. The controller 368 stores the reference power level in the form of a table, reads contents stored in a table according to a disc format, the kind of a medium, a manufacturer of the disc, and an operation mode, and provides the contents to the reference DAC 302.

The switching amplifier 304 amplifies a photodetector signal according to a predetermined gain and provides the amplified photodetector signal to the noninverting input terminal of the comparator 306. The output of the switching amplifier 304 shows the current power level. In FIG. 3, a monitor front PD signal denotes a photodetector signal that is the output of a photodetector (PD).

The switching amplifier 304 is a variable gain amplifier and the gain thereof is non-linearly controlled. The gain of the switching amplifier 304 is set according to an operation mode and whether the recording surface of a disc is a land or a groove.

The comparator 306 compares the reference power level provided by the reference DAC 302 with the current power level provided by the switching amplifier 304 and outputs a value of 0 or 1 according to the comparison result. The output of the comparator 306 is provided to the up/down counters 314 through 322.

The up/down counters 314 through 322 count up or down according to the comparison result of the comparator 306. The initial set values of the up/down counters 314 through 322 are provided by the controller 368 and are slightly different from the reference power level. It is preferable that the difference between the initial set level and the reference power level is small so that the current power level traces the reference power level quickly. However, the difference between the initial set level and the reference power level is preferably determined according to the gain and the response speed of related circuits.

The multiplexers 324 through 332 select one among two feed back loops as described below. The operators 334 through 342 operate on a mean value of the sampled current power levels, operate on a difference value between the mean value and the reference power level, control the power level, and maintain the operated value.

The DACs 344 through 352 digital to analog convert the outputs of the operators 334 through 342 and provide the digital to analog converted outputs to an LD driver (not shown).

The samplers and holders 354 through 358 sample and hold the photodetector signal output from the switching amplifier 304. The outputs of the samplers and holders 354 through 358 are analog-to-digital converted through the ADCs 308 through 312 and provided to the operators 334 through 342 via the multiplexers 324 through 332.

The NRZI detector 366 receives the NRZI signal and detects correlation between the current mark and front and rear spaces. The detection result is provided to the pulse generator 364 and determines the starting/ending position and the pulse width of each control signal.

The pulse generator 364 generates and outputs a READ control signal, a PEAK control signal, a BIAS1 control signal, a BIAS2 control signal, and a BIAS3 control signal as shown in FIG. 3 and also outputs the READ, PEAK, BIAS1, BIAS2 and BIAS3 control signals to the delay 362 along multiple paths 365. The starting/ending position and the pulse width of each signal are determined by the NRZI detector 366.

The delay 362 includes a plurality of delay devices and delays and outputs a delayed read control signal, a delayed peak control signal, a delayed bias1 control signal, a delayed bias2 control signal, and a delayed bias3 control signal along multiple paths 363 to multiplexer and gate 360. An interval for sampling the fed back photodetector signal is selected by the operations of the delay 362 and the multiplexer and gate 360. A desired portion of the fed back photodetector signal is sampled during this interval.

The multiplexer and gate 360 generates sample and hold control signals for controlling the sampling and holding operation of the samplers and holders 354, 356 and 358. The multiplexer 360 functionally includes a plurality of sets of a multiplexers and logic gates wherein each of the plurality of sets provides a sampling and hold control signal to a respective one of the samplers and holders 354, 356 and 358. Each set of multiplexers and logic gates within the multiplexer and gate 360 selects one or a plurality of signals among the delayed read control signal, the delayed peak control signal, the delayed bias1 control signal, the delayed bias2 control signal, and the delayed bias3 control signal, which are provided by the delay 362. The logic gates of a multiplexer and gate set perform a logic combination on the output of a respective multiplexer and generate a sample and hold control signal for a respective sampler and holder 354, 356 and 358 and output the sample and hold control signals along multiple path 361. The simplest form of a gate is an AND gate.

The controller 368 provides the reference power level received through the interface portion 370 to the reference DAC 302 and the operators 334 through 342 and sets initial values of the up/down counters 314 through 322. Signals S-enb, S-clk, and S-data, signifying a serial-enable, a serial-clock and a serial data, respectively supply signals needed for the interface portion 370. The controller 368 controls the gain of the switching amplifier 304, the switching positions of the multiplexers 324 through 332, and the operation modes of the operators 334 through 342 according to the operation mode, the kind of a medium, and a disc format and whether the recording surface of a disc is a land or a groove.

The monitor 372 monitors the current power level and performs interrupt to be generated by the current power level. In general, the samplers and holders 354 through 358 and the ADCs 308 through 312, which are shown in FIG. 3, are used in the state of being integrated. However, they are shown to be separated from each other for the convenience of explanation.

The operations of the apparatus shown in FIG. 3, will be described in detail. Auto laser diode power control means controlling the power level of a laser during recording/reproducing in an optical disc. Since the output of the laser changes according to temperature, control for making the laser output uniform in spite of a change in operation temperature is necessary. The control is referred to as laser output control. The auto laser diode power control is performed in order to stabilize the laser output with respect to change in temperature and to prevent deterioration of recording caused by thermal accumulation in a multi-train recording method.

The apparatus for controlling the auto laser diode power according to the present invention comprises two loops. A first loop is used in the case where the response time of a controlling circuit does not need to be fast. The first loop comprises the switching amplifier 304, the reference DAC 302, the comparator 306, the up/down counters 314 through 322, the operators 334 through 342, the DACs 344 through 352, an LD driver (not shown), an LD (not shown), a PD (not shown), and a current to voltage converter (I/V) (not shown).

A second loop is used in the case where the response time of the controlling circuit must be fast. The second loop comprises the switching amplifier 304, the samplers and holders 354 through 358, the operators 334 through 342, the DACs 344 through 352, the LD driver (not shown), the LD (not shown), the PD (not shown), and the I/V converter (not shown).

The multiplexers 324 through 332 select either the first loop or the second loop according to the kind of medium.

(1) Explanation of the operation of the first loop

The switching amplifier 304 amplifies the output signal of the PD. The photodetector signal output from the PD denotes the current power level and has the waveform of a delayed recording pulse.

The gain of the switching amplifier 304 varies according to the operation mode of a disc driver, that is, a reproducing mode, a recording mode, and an erasing mode. The photodetector signal amplified by the switching amplifier 304 is input to the non-inverting input terminal (marked with +) of the comparator 306. Also, when the input of the switching amplifier 304 is current, the switching amplifier 304 performs I/V conversion.

The reference DAC 302, realized by an eight bit DAC, receives the reference power level according to the kind of a medium and the manufacturer of the disc from the controller 368, digital to analog converts and outputs the reference power level. The reference power level output from the reference DAC 302 is input to the inverting input terminal (marked with −) of the comparator 306.

The first through fifth up/down counters 314 through 322 count up or down by one bit according to the output of the comparator 306. The first through fifth up/down counters 314, 316, 318, 320 and 322 are used to control the read power, the peak power, the bias1, the bias2, and the bias3, respectively. Although not shown in detail, each of the first through fifth up/down counters 314 through 322 includes two up/down counters. One is is used where the recording surface is a land and the other is used where the recording surface is a groove.

The first through fifth up/down counters 314 through 322 count down when the current power level is larger than the reference power level and count up when the current power level is smaller than the reference power level, as a result of comparison of the comparator 306.

The initial set levels of the first through fifth up/down counters 314 through 322 are provided by the controller 368. It is preferable that the difference between the initial set level and the reference power level is small so that the current power level traces the reference power level quickly.

The first through fifth operators 334 through 342 perform operations according to the operation modes provided by the controller 368. The first through fifth operators 334 through 342 are used for operating the read power, the peak power, the bias1 (erase) power, the bias2 (cooling) power, and the bias3 (bottom) power. The operation modes provided by the controller 368 are a sub-ALPC mode, an average ALPC mode, and a sub-average ALPC mode. The sub-ALPC mode performs ALPC by a sector period and maintains a control value latched in a mirror/gap region until a subsequent mirror/gap region occurs. The average ALPC mode averages the ALPC value for a predetermined period to control the laser diode. Sub-average ALPC performs ALPC by a sector period and maintains the average of the control value latched in the mirror/gap region until a subsequent mirror/gap region occurs. The controller 368 also outputs the LD ON signal and the HF ON signal. The LD ON signal is a laser diode driving signal and the HF ON signal is a high frequency modulation signal which is modulated in advance to prevent diffraction of and interference in an optical signal when it is output from a pickup and then reflected.

The output signals of the first through fifth DACs 344 through 352 drive the LD (not shown) through the LD driver (not shown). The output of the LD is monitored by the PD (not shown) and fed back to the switching amplifier 304 shown in FIG. 3.

(2) Explanation of the operation of the second loop

The NRZI detector 366 detects data to be recorded using NRZI data as an input. The NRZI detector 366 detects a predetermined correlation according to the sizes of front and rear spaces on the basis of the current mark and outputs the detection result to the pulse generator 364. According to an adaptive controlling method, the length of the current mark and the combination of the front and rear spaces are divided into several groups according to the length of the mark and the space. The power levels, the starting/ending positions, and the pulse widths of the respective pulses, which form the recording pulse, vary in each divided group. The power level of each pulse varies according to the energy of the NRZI signal. Here, the energy denotes the number of times the NRZI signal is converted from 0 to 1 and from 1 to 0 per unit time.

The pulse generator 364 generates power level control signals as shown in FIGS. 4C–4F for forming a recording pulse as shown in FIG. 4B, which is suitable for the detection result of the NRZI detector 366, the laser diode, the kind of a medium, and the recording speed provided by the controller 368.

The delay 362 delays and outputs the power level control signals output from the pulse generator 364. The multiplexer and gate 360 selects and combines the delayed power level control signals provided by the delay 362 and outputs a sampling and holding control signal for controlling each of the samplers and holders 354, 356 and 358.

The samplers and holders 354 through 358 perform sampling on the PD signal while the samplers and holders 354 through 358 are activated by the sampling and holding control signals. The samplers and holders 354 through 358 and the ADCs 308 through 312 continuously perform sampling and digital converting operations in a section where the second loop is activated and the sampling and holding signals are activated. The samplers and holders 354 through 358 sample the read power, the peak power, and the bias power.

The photodetector signal sampled by the samplers and holders 354 through 358 is digitally converted through the ADCs 308 through 312 and is provided to the operators 334 through 342 by way of multiplexers 324 through 342. The operators 334 through 342 compare the power level sampled by the samplers and holders 354 through 358 with the reference power level provided by the controller 368 according to the operation mode provided by the controller 368 and control the power level of the LD according to the comparison result.

The monitor 372 performs a laser diode test mode (LTM) or interrupt. The LTM is selectively performed and is used for examining the LD and examining or correctly calibrating the respective power levels during the initialization of the laser diode or the operation of the LD. Since the LD outputs an optical signal having power for recording during the performing of the LTM, the previously recorded material can be affected by the optical signal. Therefore, when the LTM is performed, recorded materials must be protected by moving a pick-up (not shown) to the inner-most or outer-most circumference of a disc or by moving an objective lens up or down as far as it will go using a focus servo (not shown).

In the case of a 4.7 GB DVD-RAM, since the ranges of bias power levels are the same, that is, 0 through 10 mW, it is possible to realize the ALPC including only the third ADC 312.

The output signals of the first through fifth DACs 344 through 352 drive the LD. The output level of the LD is fed back to the switching amplifier 304 from the PD.

In the case of the first loop using the first through fifth up/down counters 314 through 322, tracing speed is low since the first loop traces the reference power level, while moving by only one bit at one time. However, in the case of the second loop using the first through third ADCs 308 through 312, the tracing speed is high since it is possible to change all of the bits at one time without restriction.

In the case of a DVD-RAM, the first or second loop is used since the DVD-RAM has a mirror or gap region in which data is not recorded. In the case of a CD–RW or CD+RW, in which there is no mirror or gap region, the second loop is preferably used.

In the embodiment of the present invention shown in FIG. 3, the output of the laser diode controls more precisely by using the control structure having two loops. Thus, an output control value is easily maintained to be temporally infinite or to arbitrarily change the output control value.

The feedback loop using the first through fifth up/down counters 314 through 322 can prevent rapid change in power due to an abnormal phenomenon such as noise and error. However, the response speed is restricted since the feedback loop operates in units of steps. Output of the LD is controlled by each power level in an unused user data region (e.g., the gap region of a DVD-RAM). A peak holder or a bottom holder is included in the comparator 306.

In the case of a medium which does not have a gap region, the focus servo may be controlled to position the objective lens at maximum or minimum extension so that the laser is not focused on the disk and to correct each power level, while outputting each power level. At this time, since the focus servo is controlled to position the objective lens at maximum or minimum extension so that the laser is not focused on the disk, an optical signal having a level less than read power level is focused on a disc. Accordingly, the recorded data is protected. In such a method, the PD has a structure such that a certain amount of light is input among the outputs of the LD regardless of the position or the kind of the disc.

The feedback loop using the samplers and holders 354 through 358 and the ADCs 308 through 312 is processed by an approximate value since some noise can be included during sampling. However, the response speed and the change width are not restricted.

By selectively using either the first loop or the second loop, the apparatus shown in FIG. 3 can effectively control laser power according to the kind of a medium and the recording speed.

As many feedback loops as the number of required power levels are included. In the example shown in FIG. 3, the power levels are the peak level, the bias1 level, the bias2 level, the bias3 level, and the read level. Although separate ADCs and DACs are shown in the example, each of the ADCs may be replaced with a high speed ADC and each of the DACs may be replaced with a high speed DAC. That is, the respective level values are digitized using one high speed ADC. The respective level values are sampled from a recording pulse without using the peak holder or the bottom holder. Where a high speed DAC is used the recording pulse is generated using one DAC.

FIGS. 4A–4K are related timing diagrams for schematically showing the operation of the apparatus shown in FIG. 3. FIG. 4A shows an input NRZI signal and FIG. 4B shows a recording signal output from the LD. The shapes of the recording pulses change according to the kind of a medium, the recording speed and the manufacturer of the disc. The recording signal shown for purposes of illustration is for a 4.7 GByte DVD-RAM. The shape of the recording pulse changes according to a correlation between the mark and the space. FIG. 4C shows a control signal for controlling a peak power level. FIG. 4D is a control signal for controlling an erase power level. FIG. 4E is a control signal for controlling a cooling power level. FIG. 4F is a control signal for controlling a bottom power level. The recording signal of FIG. 4B is generated by combining the respective control signals shown in FIG. 4C, FIG. 4D, FIG. 4E, and FIG. 4F.

The signal shown in FIG. 4G is a fed back signal and is amplified with an appropriate gain at the moment some of the optical signal output from the LD is input to the PD and current that is output from the PD is converted into a voltage. Therefore, since it is possible to sense the power level of the light output from the LD by monitoring the signal, it is possible to appropriately control the ALPC. FIG. 4H shows a delayed peak control signal. FIG. 4I shows a delayed erase control signal. FIG. 4J shows a delayed cooling control signal. FIG. 4K shows a delayed bias control signal. The respective signals FIG. 4H, FIG. 4I, FIG. 4J, and FIG. 4K have certain time delays. The values are equal to the time delay amounts of FIG. 4B and FIG. 4G.

The time delay amounts are generated, while passing through the PD and the switching amplifier 304. In the respective signals of FIG. 4H, FIG. 4I, FIG. 4J, and FIG. 4K, the dotted lines show ranges, within which sampling and holding is performed. Sampling and holding control signals having desired positions and widths within the ranges are provided. Therefore, the generated sampling and holding control signals detect the output of the LD at appropriate positions.

FIG. 5 is a timing diagram schematically showing the generation of the sampling and holding control signals by the delayed control signals. In FIGS. 5A–5L, Q1 through Q8 of FIGS. 5A through 5I, respectively, are examples of the delayed control signals generated by the delay 362. FIGS. 5J, 5K and 5L are sampling and holding control signals generated by the multiplexer and gate 360, the sampling and holding control signals for controlling the sampling operation of the samplers and holders 354 through 358. The delay amounts of the delayed control signals are appropriately controlled.

The delayed control signals are selected and the desired sampling and holding control signals are logically generated within multiplexer and gate 360.

The gain of the switching amplifier 304 is non-linear. Therefore, overshoot or undershoot is introduced into the photodetector signal during the conversion of the gain. Such overshoot and undershoot portions are preferably avoided in sampling the photodetector signal. In order to avoid the overshoot and undershoot periods, logic combination is performed on the delayed power level control signals.

Sampling noise caused by the ADCs 308 through 312 causes change in the power level. A slight change in the sampling noise can be ignored or avoided by averaging and then, using the sampled power level in a uniform section.

FIGS. 6A–6E schematically show the operation modes of the operators 334 through 342 shown in FIG. 3. In FIG. 6A, a mirror or gap section is generated in the case of the DVD-RAM. The other sections are unused sections or sections where the focus server is controlled to position the objective lens at maximum or minimum extension so that the laser is not focused on the disk. In FIG. 6B, the ALPC value is continuously controlled. At this time, optical power may change as a result of sampling noise or a disturbance. In FIG. 6C, a change in the optical power is reduced since the ALPC value is controlled only in a specific section (the mirror or gap section) of FIG. 6A and the ALPC value is maintained at the last controlled value (the sub-ALPC mode). In FIG. 6D, change in the optical power is reduced since a certain average is obtained and the average value is reflected without reflecting the respective controlled values (the average ALPC mode). The same effect is obtained as is obtained by using a low-pass filter. FIG. 6E illustrates the case where the functions illustrated in FIG. 6C and FIG. 6D are simultaneously used. Thus, the change in the optical power due to sampling noise or a disturbance is minimized since the change amount due to the average is reflected only in a specific section and the last value is maintained in the remaining sections.

As mentioned above, according to the present invention, since rapid change in the optical output is appropriately controlled using different loops according to the kind and state of a disc, recording and reproducing performance are improved.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An auto laser diode power controlling apparatus for controlling the output of a laser diode (LD) the apparatus comprising:
    a photo detector (PD) which monitors a current power level of an optical signal output by the LD to output a current power level signal;
    a sampler and holder which samples and holds the current power level signal to output a sampled and held current power level signal;
    a sample and hold control signal generator which generates a sample and hold control signal to control the sampling operation of the sampler and holder on the basis of a non return to zero inverted (NRZI) signal, wherein:
        the sample and hold control signal generator comprises:
            a delay which receives a power level control signal corresponding to a recording pulse and generates a plurality of delayed power level control signals having different delay amounts, and
            a multiplexer and gate which combines the plurality of delayed power level control signals to generate the sample and hold control signal; and
    an operator which compares the sampled and held current power level signal with a reference power level and controls the output of the LD according to a difference between the sampled and held current power level signal and the reference power level.

2. The apparatus of claim 1, wherein the multiplexer and gate comprises:
    a multiplexer which selectively outputs the plurality of delayed power level control signals; and
    a gate which performs a logic combination on the output of the multiplexer to generate the sample and hold control signal.

3. An auto laser diode power controlling apparatus for controlling the output of a laser diode (LD), the apparatus comprising:
    a photo detector (PD) which monitors a current power level of an optical signal output by the LD to output a current power level signal;
    a sampler and holder which samples and holds the current power level signal to output a sampled and held current power level signal;
    a sample and hold control signal generator which generates a sample and hold control signal to control the sampling operation of the sampler and holder on the basis of a non return to zero inverted (NRZI) signal; and
    an operator which compares the sampled and held current power level signal with a reference power level and controls the output of the LD according to a difference between the sampled and held current power level signal and the reference power level, wherein:
        the operator averages a plurality of sampled and held current power level signals for a predetermined period to obtain an averaged level, compares the averaged level with the reference power level, and controls the output power level of the LD according to a difference between the averaged level and the reference power level.

4. An auto laser diode power controlling apparatus for controlling the output of a laser diode (LD), the apparatus comprising:
    a photo detector (PD) which monitors a current power level of an optical signal output by the LD to output a current power level signal;
    a sampler and holder which samples and holds the current power level signal to output a sampled and held current power level signal;
    a sample and hold control signal generator which generates a sample and hold control signal to control the sampling operation of the sampler and holder on the basis of a non return to zero inverted (NRZI) signal;
    a comparator which compares the current power level signal with the reference power level;
    an up/down counter which counts up or down according to the comparison result of the comparator to output a counted result;
    a multiplexer which selects one of the counted result and the sampled and held current power level signal based on a disc type and provides the selected output to the operator; and
    an operator which compares the selected output with a reference power level and controls the output of the LD according to a difference between the selected output and the reference power level.

5. The apparatus of claim 4, wherein the multiplexer selects the counted result where the disc driven by the disc reproducing apparatus is a first type and selects the sampled and held current power level signal where the disc driven by the disc reproducing apparatus is a second type.

6. A method of automatically controlling output power of a laser diode (LD), the method comprising:
   determining a current power level of an optical signal output from the LD;
   sampling and holding the current power level output based on an NRZI signal;
   comparing the sampled and held current power level with a reference power level to obtain a difference value; and
   controlling the output of the LD according to the difference value; wherein the sampling and holding comprises:
      delaying a power level control signal corresponding to a recording pulse by different delay amounts to generate a plurality of delayed power level control signals; and
   logically combining the plurality of delayed power level control signals and performing the sampling and holding based on at least one combination of the delayed power level control signals.

7. A method of automatically controlling output power of a laser diode (LD), the method comprising:
   determining a current power level of an optical signal output from the LD; sampling and holding the current cower level output based on an NRZI signal;
   comparing the sampled and held current rower level with a reference cower level to obtain a difference value; and
   controlling the output of the LD according to the difference value, wherein the comparing comprises:
      averaging the sampled and held current power level output for a predetermined period, and comparing the average level with the reference power level to obtain the difference value.

8. A method of automatically controlling output power of a laser diode (LD) in a disc recording/reproducing apparatus, the method comprising:
   monitoring a current power level of an optical signal output from the LD;
   sampling and holding the current power level of the optical signal based on an NRZI signal to output a sampled and held value;
   comparing the current power level of the optical signal with a reference power level to output a comparison result;
   counting up or down according to the comparison result to output a counted value;
   selecting one of the sampled and held value and the counted value according to a predetermined condition;
   comparing the selected value with the reference power level to obtain a difference value; and
   controlling the output of the LD according to the difference value.

9. The method of claim 8, further comprising selecting the counted value where a disc driven by the disc reproducing apparatus is a type of DVD and selecting the sampled and held value where a disc driven by the disc reproducing apparatus is a type of CD.

10. An apparatus for controlling an output power level of a laser diode (LD) applied to a medium, the apparatus comprising:
   a photodetector (PD) which monitors an output power level of the LD to output a PD signal corresponding to a current power level;
   a first auto power controller (APC) which:
      compares the PD signal with a first predetermined reference,
      counts up or down, based on the comparison to output a counted value as a first target level, and
      controls the output power of the LD based on the first target level;
   a second APC which:
      samples the PD signal,
      compares the sampled PD signal with a second predetermined reference,
      outputs a second target level based on a difference between the PD signal and the second predetermined reference, and
      controls the output power of the LD based on the second target level; and
   a selector which selects one of the first APC and the second APC according to the kind of the medium.

11. The apparatus of claim 10, wherein the selector selects the first APC where the medium is a type of DVD and selects the second APC where the medium is a type of CD.

12. The apparatus of claim 10, wherein the first APC further comprises:
   a comparator which compares the PD signal with the reference power level; and
   a counter which counts up or down according to the comparison result of the comparator.

13. The apparatus of claim 10, wherein the second APC further comprises:
   a samplerand holder which samples the PD signal;
   a sample and hold control signal generator which controls the sampling operation of the samplerand holder based on an NRZI signal; and
   an operator which compares the sampled PD signal with a reference power level and controls the output power level of the laser diode according to a difference level of the PD signal and the reference power level.

14. A method of controlling an output of a photodetector (PD) for monitoring the current power level of an optical signal output from a laser diode (LD) and an output power level of the laser diode (LD) applied to a medium, the method comprising:
   comparing the current power level output from the photodetector with the a first predetermined reference level;
   counting up or down based on the comparison, and outputting the counted result as a first target level applied to the laser diode based on the counted result;
   sampling the current power level output from the PD;
   comparing the sampled PD output with a second predetermined reference level and outputting a second target level according to a difference between the output of the PD and the second predetermined reference level; and
   selecting one of the first and second target levels according to the kind of a medium.

15. The method of claim 14, wherein the selecting comprises selecting the first target level where the medium is a type of DVD and selecting the second target level where the medium is a type of CD.

16. The method of claim 14, wherein the comparing of the current power level comprises:
   comparing the photodetector signal with the first predetermined reference level; and
   counting up or down according to the comparison result.

17. The method of claim 14, wherein:
the sampling and holding comprises sampling and holding the current power level output from the PD on the basis of an NRZI signal; and
the method further comprises controlling the output of the LD according to the selected target level.

18. An apparatus for controlling the output of a laser diode in a recording/reproducing apparatus for an optical disc, the apparatus for controlling comprising:
a photodetector which generates a signal corresponding to a power level of light output by the laser diode;
a first control loop which adjusts the power level of the laser diode based a first comparison of a difference between the photodetector signal and a first predetermined reference and a second comparison of a difference between a counted value based on the first comparison and a second predetermined reference;
a second control loop which adjusts the power level of the laser diode based on a third comparison of a sample of the photodetector signal with a third predetermined reference; and
a selector which selects one of the first and second control loops based on a type of the optical disc.

19. The apparatus of claim 18 wherein, the first control loop comprises:
a comparator which compares the photodetector signal with the first predetermined reference;
an up/down counter which counts up or down based on the comparison of the comparator to generate the counted value; and
an operator which compares the counted value with the second predetermined reference to output a laser power control signal.

20. The apparatus of claim 18, wherein the second control loop comprises:
a delay generator which delays a power level control signal corresponding to a recording pulse to output a plurality of delayed power level control signals;
a multiplexer and gate which logically combines the delayed power level control signals to output a sample and hold control signal, the sample and hold control signal timed to correspond to a predetermined portion of the recording pulse;
a sampler and holder which receives the photodetector signal and the sample and hold control signal and outputs a sampled and held value corresponding to the predetermined portion of the recording pulse; and
an operator which compares the sampled and held value with the third predetermined reference to output a laser power control signal corresponding to the predetermined portion of the recording pulse.

21. An apparatus for controlling an output power level of a laser diode (LD) applied to a recording surface of a disc, the apparatus comprising:
a photodetector (PD) which monitors an output power level of the LD to output a PD signal corresponding to a current power level of the LD;
a sampler and holder which samples and holds the PD signal to output a sampled and held PD signal, the sampling and holding operation based on a synchronization with a portion of an NRZI waveform corresponding to an LD drive pulse train;
an operator which compares the sampled and held PD signal with a predetermined reference value to output a control value based on a difference between the sampled and held PD signal and the predetermined reference; and
a controller which controls a portion of the LD drive pulse train based on the control value.

22. The apparatus of claim 21, wherein the apparatus further comprises:
a variable gain amplifier interposed between the PD and the sampler and holder; and
a processor which controls the gain of the variable gain amplifier according to an operation mode of the apparatus and whether a recording surface of the disc is a land or a groove.

23. The apparatus of claim 21, wherein the apparatus further comprises a processor which determines the predetermined reference according to a disc format, the kind of a medium, a manufacturer of the disc, and an operation mode of the apparatus.

24. The apparatus of claim 21, wherein the apparatus further comprises:
a plurality of delays which output a plurality of delayed control signals corresponding to selected portions of the NRZI waveform; and
a multiplexer and gate which logically combines selected ones of the plurality of delayed control signals to synchronize the sampling and holding operation with the NRZI waveform.

25. The apparatus of claim 24, wherein the apparatus comprises:
a plurality of samplers and holders each of which samples and holds portions of the PD signal corresponding to a respective different portion of the NRZI waveform,
a plurality of operators each of which compares the respective sampled and held signal with a corresponding predetermined reference to output a respective control value based on a difference between the respective sampled and held PD signal and the corresponding predetermined reference; and
wherein the LD controller which controls respective portions of the LD drive pulse train based on respective ones of the control values.

26. The apparatus of claim 25, wherein a number of the samplers and holders is three and a number of the operators is five and one of said three samplers and holders provides the respective sampled and held signal to three of the five operators.

27. The apparatus of claim 26, wherein the three of the five operators output respective control values to control BIAS 1, BIAS 2 and BIAS 3 portions of the LD drive pulse train.

28. The apparatus of claim 25, wherein one of the operators outputs a first control value to control a READ portion of the LD drive pulse train and another of the operators outputs a second control value to control a PEAK portion of the LD drive pulse train.

29. The apparatus of claim 21, wherein the operator averages a plurality of the sampled and held PD signals and compares the average of the plurality of sampled and held PD signals with the predetermined reference value to output the control value based on a difference between an average sampled and held PD signal and the predetermined reference.

* * * * *

UNITED STATES PATENT AND TRADEMARK OFFICE
CERTIFICATE OF CORRECTION

PATENT NO. : 6,731,586 B2
DATED : May 4, 2004
INVENTOR(S) : Jin Gyo Seo et al.

It is certified that error appears in the above-identified patent and that said Letters Patent is hereby corrected as shown below:

Column 11,
Line 47, insert -- , -- after "(LD)".

Column 13,
Line 19, indent paragraph.
Line 26, start new paragraph before "sampling".
Lines 27 and 29, change "cower" to -- power --.
Line 28, "rower" to -- power --.
Line 30, paragraph is indented too far.
Line 34, start a new paragraph before "comparing".

Column 14,
Lines 31 and 33, change "samplerand" to -- sampler and --.

Signed and Sealed this

Seventeenth Day of August, 2004

JON W. DUDAS
*Acting Director of the United States Patent and Trademark Office*